United States Patent [19]
Suzuki

[11] Patent Number: 5,285,410
[45] Date of Patent: Feb. 8, 1994

[54] CIRCUIT FOR ADJUSTING ANALOG SIGNAL WAVEFORMS

[75] Inventor: Tomohiko Suzuki, Tokyo, Japan

[73] Assignee: Addams Systems Incorporated, Tokyo, Japan

[21] Appl. No.: 782,802

[22] Filed: Oct. 25, 1991

[30] Foreign Application Priority Data

Jan. 18, 1991 [JP] Japan .......................... 3-4231

[51] Int. Cl.$^5$ .................... G11C 27/00; H03M 1/12
[52] U.S. Cl. ............................... 365/45; 341/155
[58] Field of Search ............... 365/45; 341/55; 329/50

[56] References Cited

U.S. PATENT DOCUMENTS

| | | | |
|---|---|---|---|
| 4,575,683 | 3/1986 | Roberts et al. | 329/50 |
| 4,947,371 | 8/1990 | Suzuki | 365/45 |
| 5,055,845 | 10/1991 | Ridkosil | 341/155 |

FOREIGN PATENT DOCUMENTS

| | | | |
|---|---|---|---|
| 55-34322 | 3/1980 | Japan | 365/45 |
| 58-17598 | 2/1983 | Japan | 365/45 |

Primary Examiner—Eugene R. LaRoche
Assistant Examiner—Viet Q. Nguyen
Attorney, Agent, or Firm—Keck, Mahin & Cate

[57] ABSTRACT

Circuits for matching amplitudes and/or frequencies of analog signal waveforms stored in two analog signal delay elements (hereinbelow, ADMs) are desclosed. In order to equalize amplitudes of the analog signal waveforms stored in two ADMs, peak values of the amplitudes of the analog signal waveforms stored in the two ADMs are compared, then based on the comparison result, gain of an amplifier for amplifying or attenuating amplitudes of either one of the analog waveforms is controlled. In order to equalize frequencies of the analog signal waveforms stored in the two ADMs, a term of duration between adjacent peaks of the analog signal waveforms stored in the two ADMs are compared, and then based on the comparison result, the circulation speed of the analog signal waveform in one of the ADMs is controlled.

2 Claims, 2 Drawing Sheets

CIRCUIT FOR ADJUSTING ANALOG SIGNAL WAVEFORMS

FIELD OF THE INVENTION

This invention relates to circuits for comparing two analog signal waveforms stored in two analog dynamic memory circuits, and more particularly to circuits for equalizing amplitudes and/or frequencies of the analog signal waveforms stored in two analog dynamic memory circuits to compare the analog signal waveforms.

BACKGROUND OF THE INVENTION

The analog dynamic memory circuit (hereinbelow called ADM) has been known as a memory for memorizing an analog signal waveform by circulating an analog signal waveform in a closed loop comprising a delay element such as a CCD. During this circulation, the amplitudes of the analog signal waveform are maintained by setting the gain of the loop as 1. Comparison of two analog signal waveforms in one of the applications in which ADMs are used. By means of this comparison, it is determined whether or not the analog signal waveforms are identical.

This comparison can be attained, for example, by comparing the differences between the amplitudes of the analog signal waveforms. When there are no differences, the analog signal waveforms are regarded to have the same waveform. It is assumed that two analog signals are respectively represented by $S_1(t)$ and $S_2(t)$ as follows:

$$S_1(t) = A_1 \cdot \sin(2\pi f_1 t) \quad (1)$$

$$S_2(t) = A_2 \cdot \sin(2\pi f_2 t) \quad (2)$$

When the above two signals fulfill the following requirements, that is $A_1 = A_2$ in amplitude and $f_1 = f_2$ in frequency(pitch), these signals are regarded as being identical. In other words, there is no difference between the two signals.

$$D = S_1(t) - S_2(t) = 0 \quad (3)$$

In general, the analog signals stored in two ADMs are different in amplitude and frequency(pitch), and thus a meaningless composite signal is produced if these differences exist. For instance, taking voice recognition into consideration, a word spoken by a certain person is stored in a first ADM, then the same word spoken by the same person is stored in a second ADM. But the audio signal stored in the first ADM and the signal stored in the second ADM do not always have the same amplitudes and frequencies therebetween. Even if the same person speaks the same word, the magnitudes and the tones of the voice are sometimes different. If the audio signals are represented by simple sine functions, the process of the voice recognition can also be represented as follows:

$$\begin{aligned} D &= S_1(t) - S_2(t) \\ &= A_1 \cdot \sin(2\pi f_1 t) - A_2 \cdot \sin(2\pi f_2 t) \end{aligned} \quad (4)$$

Therefore, when the magnitudes and tones of the voice for the same word of the same person are compared by using the ADMs, it is required that the amplitudes and frequencies of the audio signals stored in the two ADMs be identical.

SUMMARY OF THE INVENTION

The object of this invention is to provide a circuit for equalizing amplitudes and or frequencies of the analog signal waveforms stored in seperate ADMs.

In order to make amplitudes of analog signal waveforms stored in separate ADMs identical, according to this invention, peak values of the amplitudes of the analog signals stored in separate ADMs are compared, and the gain of an intensifying-attenuating circuit for intensifying or attenuating the amplitude of the analog signal waveforms is controlled according to the comparison result.

In order to make frequencies or pitches of analog signal waveforms stored in separate ADMs identical, according to this invention, intervals between peak values of analog signal waveforms stored in separate ADMs are compared and then the circulating speed of the analog signal waveforms in one ADM is controlled according to the comparison result.

DETAILED EXPLANATION OF THE PREFERRED EMBODIMENTS

Figure 1:
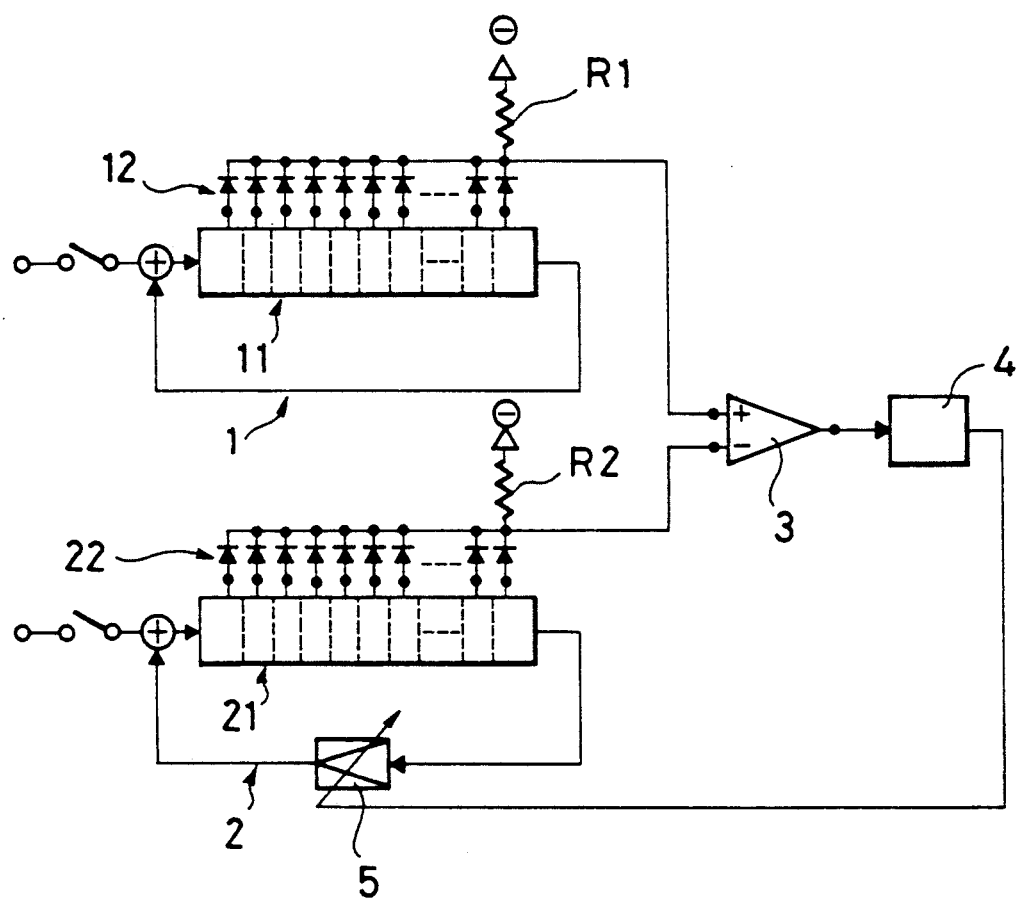
FIG. 1 is a schematic diagram of an example of a circuit for adjusting amplitudes of analog signal waveforms according to the present invention.

A circuit for adjusting amplitudes of analog waveforms will now be explained with reference to the drawings. FIG. 1 is a schematic diagram of an example of the circuit for adjusting amplitudes of analog signal waveforms according to the present invention. A first ADM 1 and a second ADM 2 respectively comprise delay elements 11 and 21 such as a CCD having a series of charge storing cells. The charge storing cells of the first and the second ADMs 1 and 2 are respectively connected to anodes of a first diode group 12 and a second diode group 22. Cathodes of the diodes are commonly connected to a negative voltage source through resistors R1 and R2 so that the diodes are put in the normal direction. Voltages of the cells are applied to respective anodes of the diodes. The voltages across the resistors R1 and R2 are determined by the respective maximum voltages Vmax among the voltages of the cells of the corresponding ADMs.

The first ADM 1 and the second ADM 2, whose loop gains are set as 1, store analog signals. Voltages at common outputs of the diode groups of the ADM 1 and the ADM 2 are the respective maximum voltages among the voltages of the cells of the ADMs. These common outputs are connected to corresponding inputs of a voltage comparator 3. The comparator 3 outputs a difference between the input signals which is inputted to a gain control circuit 4. Through this gain control circuit 4, gain of a gain variable amplifier 5 which is inserted in a closed loop of the second ADM 2 is controlled according to this difference. The loop gain of ADM 2 is controlled and an amplitude level of the signal stored in the second ADM 2 is adjusted to that of the signal in the first ADM! The amplitudes in all cells of the second ADM 2 are adjusted using the same gain until the analog signal waveform stored in ADM 2 completes one circulation.

Figure 2:
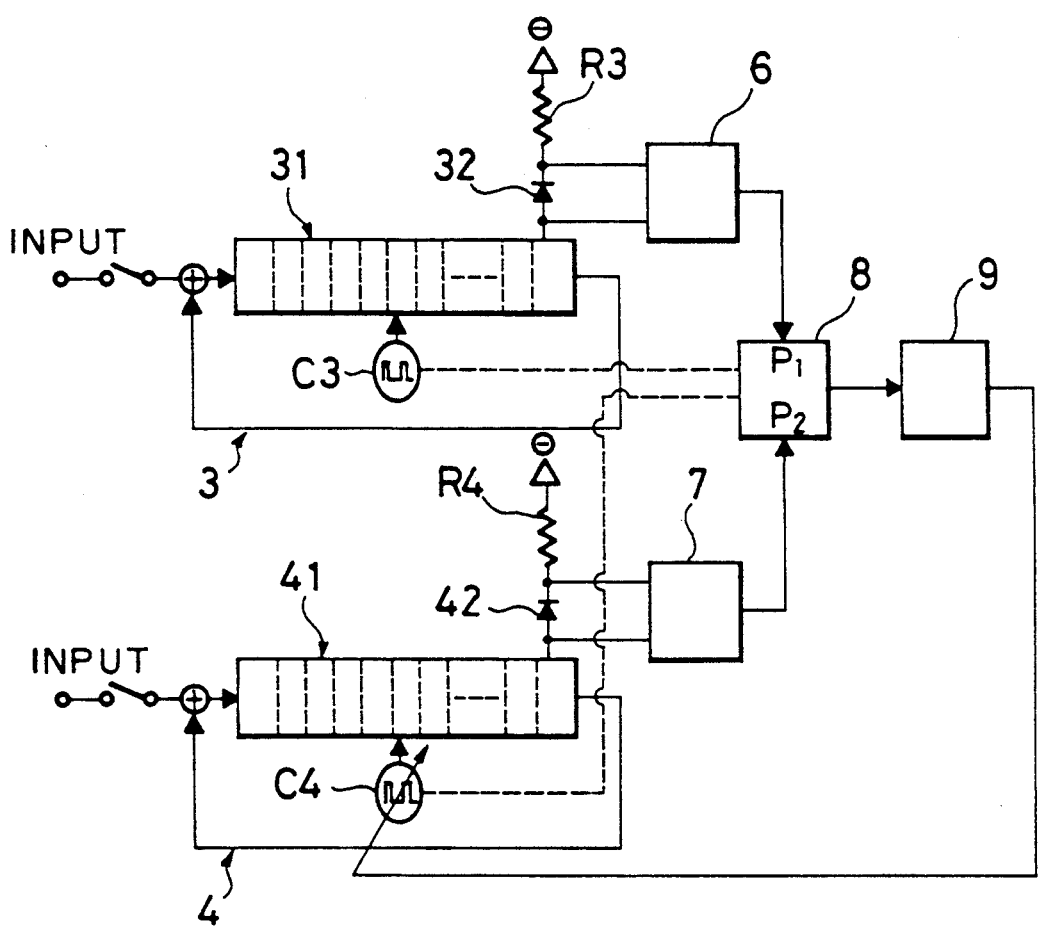
FIG. 2 is a schematic diagram of an example of a circuit for adjusting pitches of analog signal waveforms according to the present invention.

Next, a circuit for adjusting pitches of analog signal waveforms will be explained. FIG. 2 shows a schematic diagram of an example of the circuit for adjusting pitches of the analog signal waveforms. A first ADM 3 and a second ADM 4 respectively comprise delay elements 31 and 41 such as the CCD having a series of charge storing cells. The delay elements 31 and 41 are driven by clock pulses generated from clock pulse generators C1 and C2 and then the analog signal waveforms circulate in the respective closed loops. Charge storing cells at the ends of the first and the second ADMs 3 and 4 are connected to anodes of diodes 32 and 42. Cathodes of the diodes are connected to a negative voltage source through resistors R3 and R4 so that the diodes are put in the normal direction. Voltages of the respective end cells are applied to the corresponding anodes of the diodes. Peak voltage values of analog signal waveforms previously detected and stored are applied by peak detectors 6 and 7 to the cathodes. The voltage across each of the diodes is zero if the peak signal value exists in each of the end cells. In other words, in order to find out the cells having the peak signal value, zero voltages across the diodes 33 and 42 are detected by peak detectors 6 and 7.

In order to detect pitches, a term of duration between times when the voltage across the diodes 32 or 42 is zero is measured. Concretely, clock pulses generated from the clock pulse generators C1 or C2 are counted by a counter 8 from a first time when voltage across the diode is zero to a second time when voltage across the diode is zero. This process is carried out both in the ADM 1 and the ADM 2, and pitches $P_1$ and $P_2$ are measured by a counter 8.

A ratio of the measured pitches $P_1$ and $P_2$ is calculated, or a difference $d = P_1 - P_2$ is obtained. A clock control voltage circuit 9 generates a clock control voltage according to the above ratio or the difference and applies it to the clock pulse generator C2 to adjust the clock pulse frequency.

When the pitch of the signal in the ADM 2 is shorter than that of the signal in the ADM 1, the clock pulse frequency of the ADM 2 is adjusted so that the clock pulse cycle is elongated or the clock is retarded. On the other hand, when the pitch of the signal in the ADM 2 is elongated, the clock of the ADM 2 is quickened.

As described above, the pitches of the analog signals stored in the ADM 1 and ADM 2 can be adjusted.

According to this invention, amplitudes and/or pitches (frequencies) of analog signals stored in the two ADMs can be matched with each other, and thus preprocessing for determining whether or not two analog singnals are substantially identical can be attained.

What is claimed is:

1. A circuit for adjusting analog signal waveforms to equalize amplitudes of two analog signal waveforms including:

first and second analog dynamic memory circuits each comprising a closed loop in which a first or a second analog signal waveform circulates, said closed loop including an analog signal waveform delay element comprising a series of charge storing cells, a first peak detector which comprises a first diode group having a plurality of diodes which are connected in the normal-biased direction between the charge storing cells of the delay element of said first analog dynamic memory circuit and a common output connected to a bias voltage supply for detecting the peak value of the first analogs signal waveform stored at the common output of the first analog dynamic memory circuit;

a second peak detector comprising a second diode group having a plurality of diodes which are connected in the normal-biased direction between the charge storing cells of the delay element of said second analog dynamic memory circuit and a common output connected to a bias voltage supply for detecting the peak value of the second analog signal waveform at the common output of the second analog dynamic memory circuit;

a comparator having a first input connected to the common output of the first peak detector, a second input connected to the common output of the second peak detector and an output for outputting a signal representing a ratio of or a difference between the peak values inputted from the first and the second inputs; and a variable gain amplifier having an input connected to the output of said comparator and provided in the closed loop of the first or the second analog dynamic memory circuit, a gain of the variable gain amplifier being varied according to the signal representing the ratio or the difference, thereby amplifying or attenuating the amplitude of the first or the second signal waveform.

2. A circuit for adjusting analog signal waveforms to equalize pitches of two analog signal waveforms including:

first and second analog dynamic memory circuits each comprising a closed loop in which a first or a second analog signal waveform circulates, said closed loop including an analog signal waveform delay element comprising a series of charge storing cells;

a first peak detector having a first diode connected in the normal-biased direction between one of the charge storing cells of the delay element of the first analog dynamic memory circuit and a bias power supply, the end of the diode to which the bias power supply is connected being provided with a previously detected peak value, thereby detecting a peak of the first analog signal waveform when a voltage across the diode is zero;

a second peak detector having a second diode connected in the normal-biased direction between one of the charge storing cells of the delay element of the first analog dynamic memory circuit and a bias power supply, the end of the diode to which the bias power supply is connected being provided with a previously detected peak value at the other end of the diode, thereby detecting a peak of the second analog signal waveform when a voltage across the diode is zero;

a peak to peak duration detection circuit for measuring respective time of peak to peak durations between two adjacent peaks of the first and the second analog waveforms which are detected by said first and said second peak detectors;

a comparator connected to said peak to peak duration detection circuit, for obtaining a ratio of or a difference between the time of peak to peak durations of the first and the second analog waveforms to output a signal representing the ratio or the difference; and means for varying a circulating speed of the analog signal waveform stored in the first or the second analog dynamic memory circuit according to the signal representing the ratio or the difference outputted from the comparator.

* * * * *